US009638852B2

(12) United States Patent
Sakai

(10) Patent No.: US 9,638,852 B2
(45) Date of Patent: May 2, 2017

(54) POINT LIGHT SOURCE, PLANAR LIGHT SOURCE DEVICE, AND DISPLAY DEVICE

(71) Applicant: Mitsubishi Electric Corporation, Tokyo (JP)

(72) Inventor: Seiji Sakai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 11 days.

(21) Appl. No.: 14/251,715

(22) Filed: Apr. 14, 2014

(65) Prior Publication Data

US 2014/0355305 A1    Dec. 4, 2014

(30) Foreign Application Priority Data

May 28, 2013 (JP) ................................. 2013-111534

(51) Int. Cl.
*F21K 99/00*    (2016.01)
*F21V 8/00*    (2006.01)
(Continued)

(52) U.S. Cl.
CPC ............ *G02B 6/0011* (2013.01); *G02B 6/003* (2013.01); *G02B 6/0021* (2013.01);
(Continued)

(58) Field of Classification Search
CPC . F21V 5/046; F21V 5/04; F21V 5/048; G02B 6/0011; G02B 6/0013;
(Continued)

(56) References Cited

U.S. PATENT DOCUMENTS 6,679,621 B2 *    1/2004   West .......................... F21V 5/04
                                                257/E33.059
7,300,185 B1 *    11/2007  Ruffin ....................... F21K 9/00
                                                362/334
(Continued)

FOREIGN PATENT DOCUMENTS

JP    2006-054407 A    2/2006
JP    2006-525682 A    11/2006
(Continued)

OTHER PUBLICATIONS

An Office Action issued by the Korean Patent Office on Jun. 5, 2015, which corresponds to Korean Patent Application No. 10-2014-0057577 and is related to U.S. Appl. No. 14/251,715; with English language translation.
(Continued)

*Primary Examiner* — Andrew Coughlin
*Assistant Examiner* — Colin Cattanach
(74) *Attorney, Agent, or Firm* — Studebaker & Brackett PC

(57) ABSTRACT

An envelope of a point light source includes first to fourth surfaces. The first surface protrudes ahead of a light-emitting element and extends to a left side and a right side of the light-emitting element when viewed from the light-emitting element. The second surface is connected to the first surface on the left side and the right side of the light-emitting element and is in contact with the light-emitting element. The third surface is connected to an upper end of the first surface and an upper end of the second surface and forms a first depression that sinks from the first surface toward the second surface. The fourth surface is connected to a lower end of the first surface and a lower end of the second surface and forms a second depression that sinks from the first surface toward the second surface.

10 Claims, 7 Drawing Sheets

(51) Int. Cl.
  *H01L 33/54* (2010.01)
  *G02B 19/00* (2006.01)
  *F21Y 105/00* (2016.01)
  *F21Y 103/10* (2016.01)
  *F21Y 115/10* (2016.01)

(52) U.S. Cl.
  CPC ......... *G02B 6/0088* (2013.01); *G02B 6/0091* (2013.01); *G02B 19/0028* (2013.01); *G02B 19/0061* (2013.01); *H01L 33/54* (2013.01); *F21Y 2103/10* (2016.08); *F21Y 2105/00* (2013.01); *F21Y 2115/10* (2016.08)

(58) Field of Classification Search
  CPC .... G02B 6/0021; G02B 6/009; G02B 6/0091; G02B 19/0028; G02B 19/0061; H01L 33/54
  USPC .......................... 362/311.02, 608, 612, 621
  See application file for complete search history.

(56) References Cited

U.S. PATENT DOCUMENTS

| | | | |
|---|---|---|---|
| 7,348,723 B2* | 3/2008 | Yamaguchi | G02B 3/04 257/E33.073 |
| 7,575,358 B2* | 8/2009 | Suzuki | G02B 5/045 362/612 |
| 7,943,951 B2* | 5/2011 | Kim | H01L 33/58 257/100 |
| 8,337,054 B2* | 12/2012 | Bernard | F21V 5/04 362/335 |
| 2004/0183081 A1* | 9/2004 | Shishov | H01L 33/501 257/79 |
| 2004/0227149 A1* | 11/2004 | Ibbetson | H01L 33/54 257/100 |
| 2005/0068786 A1* | 3/2005 | Ishida | F21S 48/1154 362/509 |
| 2006/0002141 A1* | 1/2006 | Ouderkirk | G02B 6/0001 362/609 |
| 2006/0034097 A1* | 2/2006 | Hahm | H01L 33/58 362/555 |
| 2007/0008739 A1* | 1/2007 | Kim | G02B 6/0021 362/612 |
| 2010/0080012 A1* | 4/2010 | Bernard | F21V 5/04 362/509 |
| 2010/0232166 A1* | 9/2010 | Ho | F21V 5/04 362/335 |
| 2010/0259706 A1 | 10/2010 | Kuwaharada et al. | |
| 2010/0328940 A1* | 12/2010 | Huang | F21S 8/086 362/235 |
| 2011/0019400 A1* | 1/2011 | Huang | F21V 5/04 362/235 |
| 2012/0013811 A1 | 1/2012 | Shimizu | |
| 2012/0044441 A1 | 2/2012 | Shigeta et al. | |
| 2013/0094218 A1* | 4/2013 | Wang | F21V 5/04 362/311.02 |

FOREIGN PATENT DOCUMENTS

| | | |
|---|---|---|
| JP | 2009-158177 A | 7/2009 |
| JP | 2011-113648 A | 6/2011 |
| JP | 4956977 B2 | 3/2012 |
| KR | 2011-0134439 A | 12/2011 |
| WO | 2009/157166 A1 | 12/2009 |
| WO | 2010/119590 A1 | 10/2010 |

OTHER PUBLICATIONS

An Office Action issued by the Korean Patent Office on Dec. 24, 2015, which corresponds to Korean Patent Application No. 10-2014-0057577 and is related to U.S. Appl. No. 14/251,715; with English language translation.

An Office Action; "Reason for Refusal," issued by the Korean Patent Office on Apr. 29, 2016, which corresponds to Korean Patent Application No. 10-2016-0035313 and is related to U.S. Appl. No. 14/251,715; with English language translation.

An Office Action issued by the Korean Patent Office on Nov. 7, 2016, which corresponds to Korean Patent Application No. 10-2016-0035313 and is related to U.S. Appl. No. 14/251,715; with English language partial translation.

An Office Action; "Notice of Reasons for Refusal," issued by the Japanese Patent Office on Feb. 14, 2017 which corresponds to Japanese Patent Application No. 2013-111534 and is related to U.S. Appl. No. 14/251,715; with English language translation.

* cited by examiner

F I G . 1
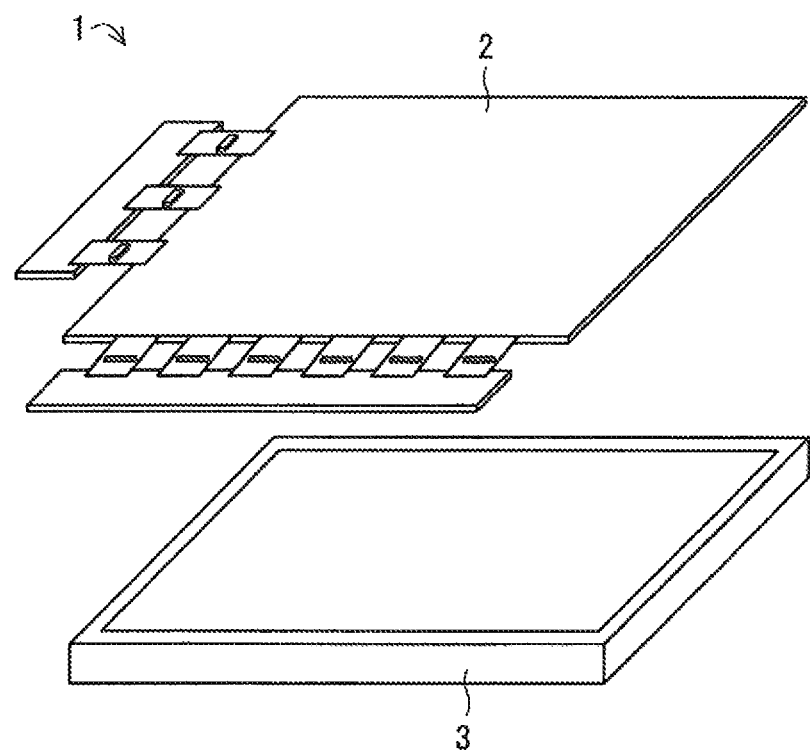

F I G . 2
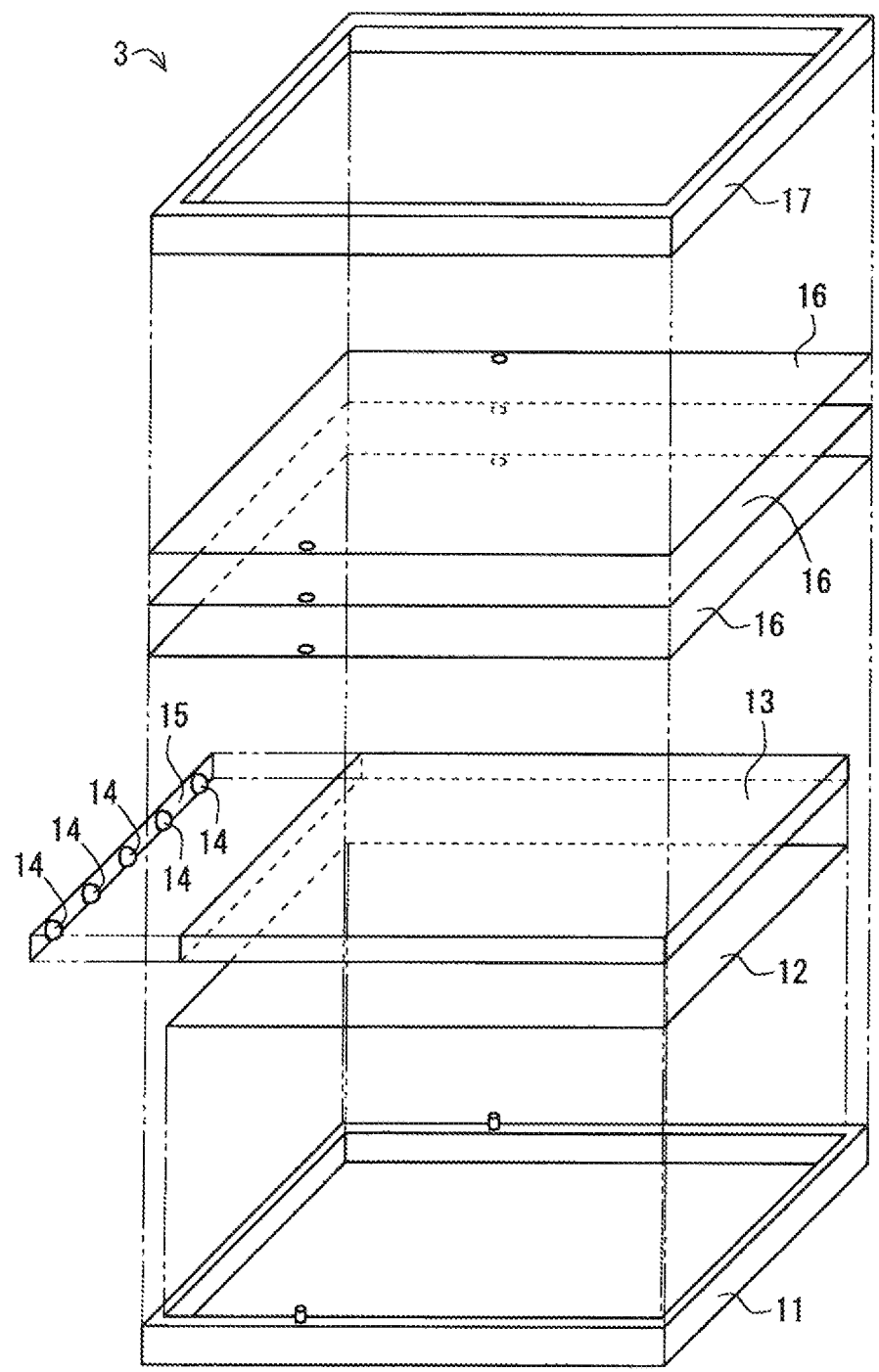

POINT LIGHT SOURCE, PLANAR LIGHT SOURCE DEVICE, AND DISPLAY DEVICE

BACKGROUND OF THE INVENTION

Field of the Invention

The present invention relates to a point light source, a planar light source device, and a display device.

Description of the Background Art

Japanese Patent No. 4956977 and Japanese Patent Application Laid-Open No. 2011-113648 each disclose a point light source using a light-emitting diode (LED) (hereinafter may be referred to as a LED point light source) as a light-emitting element.

In the LED point light source of Japanese Patent No. 4956977, the LED on a substrate is covered by resin. The resin has a first plane including one long side of the substrate, and a second plane that faces the first plane and includes the other long side of the substrate. The resin is semicircular when viewed from the first plane side and the second plane side. This semicircular curved surface forms a light-emitting surface (lens forming surface) of the LED point light source. The first and the second planes are parallel to a main surface of a light guide plate. The light-emitting surface is orthogonal to the first and the second planes, and the main surface of the light guide plate.

In the LED point light source of Japanese Patent Application Laid-Open No. 2011-113648, resin that covers the LED includes a rectangular cuboid base and a protruding portion of an elliptical hemisphere protruding forward from the front surface of the base.

In the LED point light source of Japanese Patent No. 4956977, a portion of light generated in the LED travels straight toward a light-emitting surface of resin that exists ahead. Meanwhile, most light travels to the first and the second resin planes, and arrives at the light-emitting surface while being reflected between these two planes. The first plane is mounted on a substrate, which is adapted to facilitate reflection on the first plane. The second plane is provided with a reflective member, which is adapted to facilitate reflection on the second plane.

However, for example, from among light reflected by the first and the second planes and arrives at the light-emitting surface at a large incidence angle, some light may be totally reflected by the light-emitting surface and may not be emitted from the light-emitting surface. This will lower light extraction efficiency (in other words, LED light utilization efficiency).

In addition, when reflection is repeated by the first and the second planes, an optical path in the resin will become longer. Accordingly, even if the light reflected by the first and the second planes is finally emitted from the light-emitting surface, only light intensity attenuated in proportion to the number of reflection and the optical path length is obtained. Also from this viewpoint, the light extraction efficiency will become lower.

Referring to a longitudinal section (cross-section which passes through the LED and is orthogonal to the first and second planes of resin, in other words, cross-section which passes through the LED and is orthogonal to the upper and lower main surfaces of the light guide plate), light is emitted at various angles from the light-emitting surface. For example, when light reflected by the first and the second planes is emitted from the light-emitting surface at a large emitting angle, the light will have a small incidence angle with respect to the main surface of the light guide plate after entering the light guide plate. Then, the light will travel within the light guide plate while repeating reflection between the upper and lower main surfaces of the light guide plate. Since repeated reflection and resulting increase in the optical path length cause attenuation of light intensity, however, the light cannot travel far in the light guide plate.

Accordingly, the light utilization efficiency becomes lower in the light guide plate, in other words, in a planar light source device. As a result, the entire brightness becomes lower. Moreover, places far from the LED point light source become darker, generating brightness unevenness.

In the LED point light source of Japanese Patent Application Laid-Open No. 2011-113648, as described above, the resin that covers the LED includes the rectangular cuboid base and the protruding portion provided in front of the base. Since the protruding portion from which light is emitted has a shape of an elliptical hemisphere, light that is totally reflected by the protruding portion and is not emitted may be reduced compared with the LED point light source of Japanese Patent No. 4956977.

However, other problems that describe the LED point light source of the Japanese Patent No. 4956977 are considered to be applicable to the LED point light source of Japanese Patent Application Laid-Open No. 2011-113648.

SUMMARY OF THE INVENTION

It is an object of the present invention to provide a point light source that can improve the light utilization efficiency and to provide a point light source that can improve the light utilization efficiency in a planar light source device when applied to the planar light source device. It is another object of the present invention to provide a planar light source device and display device to which such a point light source is applied.

A point light source according to an aspect of the present invention includes a light-emitting element and an envelope that has light-transmitting property and seals the light-emitting element. The envelope has first to fourth surfaces. The first surface protrudes ahead of the light-emitting element and extends to the left side and the right side of the light-emitting element when viewed from the light-emitting element. The second surface is connected to the first surface on the left side and the right side of the light-emitting element and is in contact with the light-emitting element. The third surface is connected to the upper end of the first surface and the upper end of the second surface and forms a first depression that sinks from the first surface toward the second surface. The fourth surface is connected to the lower end of the first surface and the lower end of the second surface and forms a second depression that sinks from the first surface toward the second surface.

According to the aspect described above, light travelling from the light-emitting element to the third and fourth surfaces is reflected by the third and fourth surfaces, travels to the first surface, and is emitted from the first surface to outside of the envelope. Accordingly, it is possible to reduce the number of times of reflection and optical path length in the envelope, thereby it is possible to suppress resulting stray light and intensity attenuation. This improves the utilization efficiency (in other words, the light extraction efficiency) of the light emitted from the light-emitting element.

According to the aspect described above, it is possible to suppress that the light reflected by the third and fourth surfaces enters the first surface at a large incidence angle, thereby it is possible to cause more light to travel ahead of the first surface. Therefore, when the point light source is combined with a light guide plate to configure a planar light source device, it is possible to cause the light from the light-emitting element to enter the light guide plate efficiently, and it is possible to cause the light to efficiently travel far in the light guide plate. This improves the light utilization efficiency in the planar light source device. As a result, the use of the point light source enables provision of a planar light source device and display device having uniform in-plane brightness and high display quality.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is an exploded perspective view of a display device according to a first preferred embodiment;

FIG. 2 is an exploded perspective view of a planar light source device according to the first preferred embodiment;

DESCRIPTION OF THE PREFERRED EMBODIMENTS

First Preferred Embodiment

Figure 3:
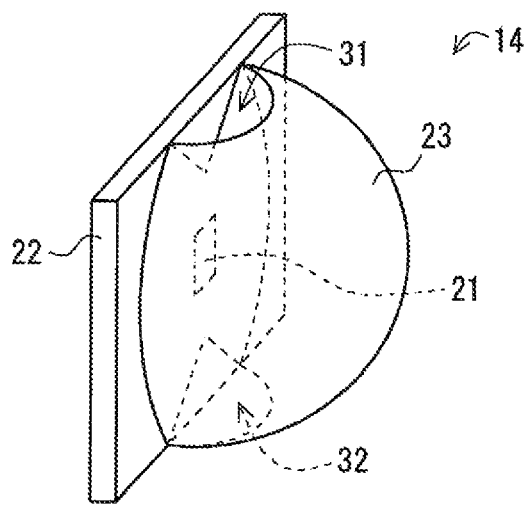
FIG. 3 is a perspective view of a point light source according to the first preferred embodiment.

FIG. 1 illustrates an exploded perspective view of a display device 1 according to a first preferred embodiment. According to the example of FIG. 1, the display device 1 includes a display panel 2 and a planar light source device 3. Herein, a liquid crystal panel will be exemplified as the display panel 2. In view of such an example, hereinafter, the display panel 2 may be referred to as a liquid crystal panel 2, the display device 1 may be referred to as a liquid crystal display device 1, and the planar light source device 3 may be referred to as a back light device 3. While a thin, narrow-frame display device is assumed as the liquid crystal display device 1, the liquid crystal display device 1 is not limited to this example.

The liquid crystal panel 2 includes, for example, a thin film transistor (TFT) array substrate, a counter substrate facing the TFT substrate, and liquid crystals disposed between these two substrates. A large number of pixels are disposed, for example, in a matrix in a display area of the liquid crystal panel 2. The TFT array substrate is provided with the TFT, which is an example of a semiconductor switching element, at each pixel. Herein, it is assumed that the display area is an oblong rectangle, that gate lines (also referred to as address lines) are formed in parallel with the long side of the display area, and that source lines (also referred to as data lines) are formed in parallel with the short side of the display area.

A plurality of gate-line-driving drivers each causing the TFT provided at each pixel to turn on and off, and a plurality of source-line-driving drivers each supplying image data to each pixel via the TFT are formed on a periphery of the display area. These drivers are, for example, formed on the TFT array substrate as semiconductor chips. Each driver is controlled by a controller and, thereby writing data (pixel data) into each pixel. The data is written in each pixel according to an image signal. Specifically, the gate lines are sequentially turned on with a predetermined scanning period. The pixel data is then written in the pixel connected to the turned-on gate line.

The back light device 3 is a planar light source device that emits planar light from an opening of a housing thereof. The liquid crystal panel 2 is disposed on the back light device 3 with the back of the liquid crystal panel 2 facing the opening of the housing of the back light device 3. This causes the light emitted from the back light device 3 to illuminate the liquid crystal panel 2. The opening of the housing has an oblong rectangle slightly larger than the display area of the liquid crystal panel 2. The long side of the opening is parallel with the gate line of the liquid crystal panel 2.

The liquid crystal panel 2 may be a transmissive or semi-transmissive liquid crystal panel that uses illumination light emitted from the back light device 3 as back light. That is, the structure of the liquid crystal panel 2 is not limited to the above-mentioned example as long as the liquid crystal panel 2 is transmissive or semi-transmissive.

FIG. 2 illustrates an exploded perspective view of the back light device 3. According to the example of FIG. 2, the back light device 3 includes a lower case 11, a reflective sheet 12, a light guide plate 13, a plurality of point light sources 14, a substrate 15, a plurality of optical sheets 16, and an upper case 17.

The lower case 11 and the upper case 17 are fitted in to form a housing that accommodates and maintains the reflective sheet 12, the light guide plate 13, the plurality of point light sources 14, the substrate 15, and the plurality of optical sheets 16. The upper case 17 is a frame member having the above-mentioned housing opening for extracting illumination light. The lower case 11 is made of, for example, synthetic resin that is excellent in strength and processability. The upper case 17 is made of, for example, synthetic resin or metal that is excellent in strength and processability. For example, the use of a stainless plate makes it possible to reduce thickness and to ensure strength of the back light device 3.

The reflective sheet 12 is disposed on the bottom of the lower case 11. The light guide plate 13 is disposed on the reflective sheet 12. The plurality of point light sources 14 are disposed along one side of the light guide plate 13.

The reflective sheet 12 is a sheet-like optical member for reflecting light that leaks from the back of the light guide plate 13 into the front side (that is, emission surface of the illumination light) of the light guide plate 13. The reflective sheet 12 is made of, for example, a flat plate on which silver is vapor-deposited or a white resin plate. In order to extract the light of each point light source 14 effectively as illumination light, preferably a reflectance of the reflective sheet 12 is 90% or more.

The light guide plate 13 is an optical member for guiding light of each point light source 14, which enters a side surface of the light guide plate 13, to the front surface of the light guide plate 13. The light guide plate 13 is light-transmissive, and has a planar or wedge-like shape. The light guide plate 13 is made of organic resin, such as, for example, an acrylic resin and a polycarbonate resin. Alternatively, the light guide plate 13 may be made of, for example, glass.

A diffusion pattern for causing the light that propagates in the light guide plate 13 to diffuse and to be emitted from the front surface of the light guide plate 13 is formed on the back surface of the light guide plate 13. The diffusion pattern can be formed by a fine shape, such as, for example, depression and projection, and notching. Methods of forming the diffusion pattern includes, for example, printing a white pigment containing titanium oxide onto a dot pattern. Alternatively, the diffusion pattern may be formed by molding a circular, conical, or quadrangular fine pattern at the time of molding of the light guide plate 13. The adjustment of the diffusion pattern makes it possible to form a desired brightness distribution in a direction perpendicular to an arrangement of each point light source 14, that is, in a direction parallel to the long side of an illumination light emitting region. In other words, properties such as concentration, shape, size, and depth of the diffusion pattern are determined so that the brightness distribution of the illumination light becomes optimal.

The optical sheet 16 is a light-transmitting, sheet-like optical member, and is disposed on the front surface of the light guide plate 13. The optical sheet 16 is, for example, a diffusion sheet that diffuses light. The diffusion sheet may be formed by mixing a fine reflective material with transparent members, such as synthetic resin and glass. Alternatively, the diffusion sheet may be formed by roughening the surface. Alternatively, the optical sheet 16 is, for example, a prism sheet in which a prism line is formed. The number of the optical sheet 16 may be one sheet, or may be a plurality of sheets. For example, in order to form desired brightness distribution and chromaticity distribution of emitted light, a plurality of types of optical sheet 16 are used. A plurality of sheets of an identical type of optical sheet 16 may be used. The number of optical sheet 16 is not limited to the example of FIG. 2.

In the example of FIG. 2, the plurality (herein five pieces) of point light sources 14 are arranged in a line along one side surface of the light guide plate 13. These point light sources 14 are disposed on a common substrate 15. The substrate 15 will be referred to as a light source substrate 15. The light source substrate 15 has a wiring, a circuit, and the like for supplying electric power to each point light source 14. For example, depending on the size of the back light device 3, the number of the point light sources 14 may be one. In addition, one or more point light sources 14 may be disposed on each of the plurality of side surfaces of the light guide plate 13.

Figure 4:
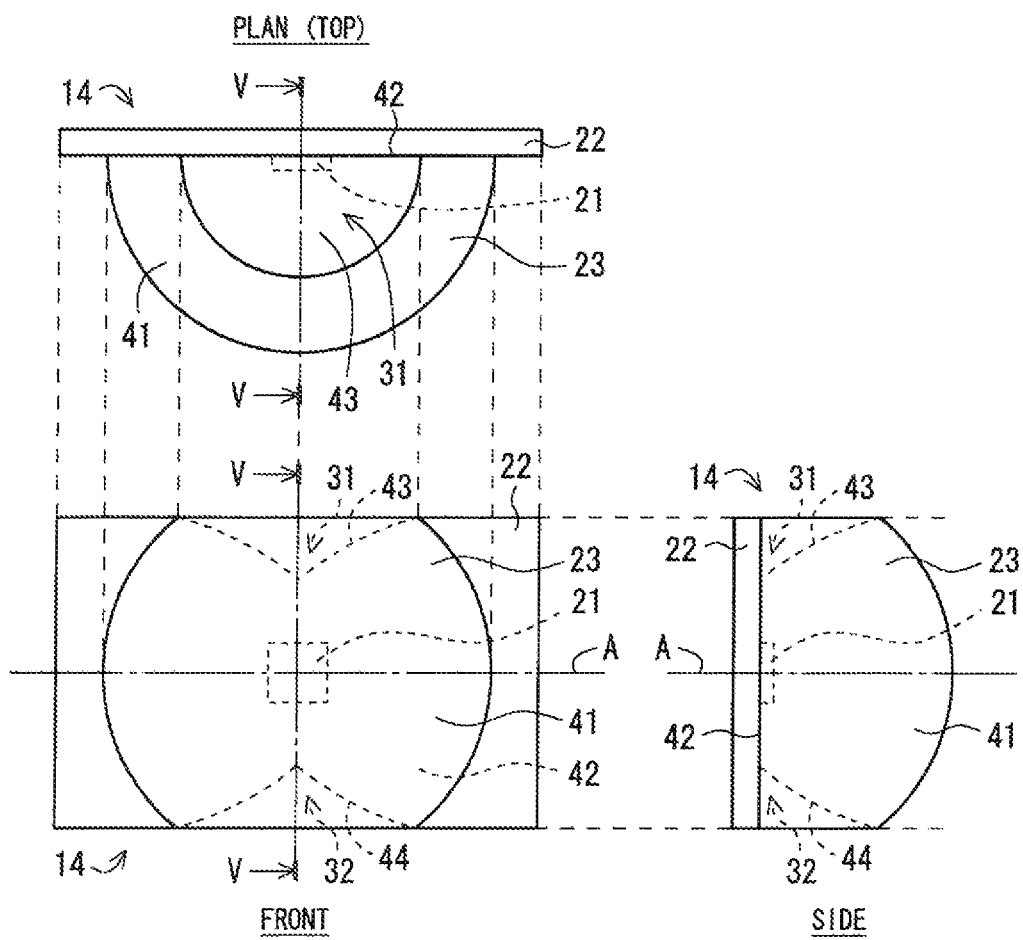
FIG. 4 is an illustrative diagram combining a front view, plan view, and side view of the point light source according to the first preferred embodiment.
Figure 5:
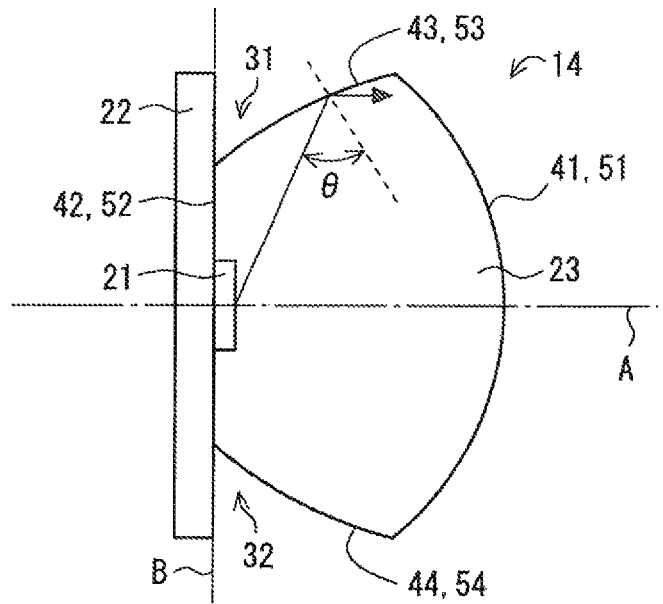
FIG. 5 is a cross-sectional view taken along line V-V in FIG. 4.

FIGS. 3 to 5 are illustrative diagrams of the point light source 14. FIG. 3 is a perspective view. FIG. 4 is a diagram combining a front view, a plan view (in other words, top view), and a side view. FIG. 5 is a cross-sectional view (longitudinal cross-sectional view) taken along line V-V in FIG. 4. According to the example of FIGS. 3 to 5, the point light source 14 includes a light-emitting element 21, an element substrate 22, and an envelope 23.

The light-emitting element 21 is realized by, for example, a light-emitting diode (LED) which is a semiconductor light-emitting element. A laser diode (LD) is one type of light-emitting diode. As the light-emitting element 21, for example, an electro luminescence (EL) element represented by an organic EL may be used. In the light-emitting element 21, the surface of the side from which light is emitted will be referred to as a front surface. The surface of the opposite side of the front surface will be referred to as a back surface.

Hereinafter, a case in which the light-emitting element 21 is a pseudo-white LED is assumed. The light-emitting element 21 however is not limited to this example. The pseudo-white LED is configured by, for example, combining an LED that emits blue light and a phosphor that absorbs a portion of light emitted from the blue LED and emits yellow light. Alternatively, it is also possible to configure the pseudo-white LED by combining LEDs each for red (R), green (G), and blue (B). In this case, white light is obtained by merging the three monochromatic lights.

The element substrate 22 includes an insulating plate and wiring. The element substrate 22 is realized by, for example, low temperature co-fired ceramics (LTCC). In LTCC, layers made of a mixture of an alumina aggregate and a glass material are piled, and conductor patterns (forming wiring etc.), such as Ag and Cu, are formed between the layers.

While the firing temperature of alumina ceramics is approximately 1500° C., the firing temperature of LTCC is approximately 900° C. that is lower than the melting point of low-resistance conductors, such as Ag and Cu. Since ceramics dissipate heat well, it is possible to efficiently guide heat generated from the light-emitting element 21 to a heat-dissipating member, such as a housing, via the light source substrate 15 (see FIG. 2) and a flexible printed circuit (FPC) connected to the light source substrate 15. Ceramics, which have high resistance to environment, are widely used.

The element substrate 22 has a lead frame (not illustrated) on one main surface. The back surface of the light-emitting element is die-bonded onto the lead frame. This connects a terminal on the back surface side of the light-emitting element 21 to the lead frame electrically. A terminal on the front surface side of the light-emitting element 21 is electrically connected to the other terminal of the lead frame by a bonding wire (not illustrated). In the element substrate 22, the surface on which the light-emitting element 21 is disposed will be referred to as a front surface, and the surface opposite the front surface will be referred to as a back surface.

The back surface of the element substrate 22 is provided with a terminal portion formed with copper or gold-plated copper. The light source substrate 15 (see FIG. 2) and the FPC are connected to such a terminal portion by soldering, etc. The lead frame provided in the front surface of the element substrate 22 is electrically connected to the terminal portion provided in the back surface of the element substrate 22 via a through hole, etc.

The envelope 23 is a light-transmissive member for sealing the light-emitting element 21. The envelope 23 covers the light-emitting element 21 and is disposed over the light-emitting element 21 and the element substrate 22. Herein, a case where the envelope 23 is made of resin is exemplified, but the material of the envelope 23 is not limited to this example. Preferably, the envelope 23 has high light transmittance, and excellent heat resistance and UV resistance. Examples of resin having such properties include an epoxy resin. The epoxy resin is widely used from a viewpoint of cost and productivity. The envelope 23 may be made of silicone resin that is more excellent in heat resistance and light resistance. When resin is used, it is possible to form the envelope 23 by methods such as the transfer mold method and the injection method.

According to the example of FIGS. 3 to 5, the envelope 23 has a basic external shape of a hemisphere centered on the position of the light-emitting element 21. The hemisphere is depressed in a vertical direction of the light-emitting element 21 (see depressions 31, 32). For convenience of description, the vertical direction refers to a vertical direction in a posture illustrated in FIG. 3, that is, in the posture in which the element substrate 22 is upright. Even if the vertical direction is specified in this way, the description of the point light source 14 etc. will maintain generality.

More specifically, the external shape of the envelope 23 includes first to fourth surfaces 41 to 44. The inside of space surrounded by the surfaces 41 to 44 is filled with resin that is the material of the envelope 23. That is, the envelope 23 is not hollow but solid.

The first surface 41 is a surface for extracting light emitted from the light-emitting element 21 to outside of the point light source 14. The first surface 41 is a curved surface protruding ahead of the light-emitting element 21 when viewed from the light-emitting element 21 (that is, in a light emission direction, and herein in a direction perpendicular to the front surface of the light-emitting element 21 and the front surface of the element substrate 22). The first surface 41 extends to the left side and the right side of the light-emitting element 21 (left side and right side when seeing the envelope 23 from the light-emitting element 21). In the example of FIG. 3 to FIG. 5, the first surface 41 has a spherical shape centered on the position of the light-emitting element 21.

Herein, the spherical shape includes not only a shape strictly defined mathematically but also a shape that can be substantially considered to be identical to a spherical shape. Such a concept is also applied to shapes of other surfaces 42 to 44.

The second surface 42 is connected to the first surface 41 on the left side and the right side of the light-emitting element 21. The second surface 42 is however not connected to the first surface 41 in the upper portion and lower portion of the first surface 41. The second surface 42 is located on the light-emitting element 21 side rather than on the first surface 41 side, and is in contact with the light-emitting element 21. The second surface 42 is also in contact with the element substrate 22 around the light-emitting element 21, and thereby sealing the light-emitting element 21 by the envelope 23.

The second surface 42 has a plane shape in accordance with the difference of elevation caused by the light-emitting element 21 and the element substrate 22. Accordingly, the second surface 42 has a plane shape into which the light-emitting element 21 is pressed. However, since the second surface 42 is flat compared with other surfaces 41, 43, and 44, the second surface 42 may be handled as a plane for convenience of description.

The third surface 43 connects the upper end of the first surface 41 and the upper end of the second surface 42. The third surface 43 has a plane shape that sinks from the first surface 41 toward the second surface 42, thereby forming the first depression 31 in the upper portion of the envelope 23.

The fourth surface 44 connects the lower end of the first surface 41 and the lower end of the second surface 42. The fourth surface 44 has a plane shape that sinks from the first surface 41 toward the second surface 42, thereby forming the second depression 32 in the lower portion of the envelope 23.

In the example of FIG. 3 to FIG. 5, the third surface 43 has a half-conical shape (a shape obtained by cutting a conic surface in half at a plane passing through a vertex of the conic surface). The vertex of the half-conical shape points at the light-emitting element 21, and is located above the light-emitting element 21. Similarly, the fourth surface 44 also has a half-conical shape with the vertex pointing at the light-emitting element 21, and the vertex is located under the light-emitting element 21.

The third surface 43 and fourth surface 44 have plane symmetry with respect to a plane A illustrated in FIG. 4 and FIG. 5. The plane A is a horizontal plane that passes through the light-emitting element 21, and is orthogonal to the vertical direction of the light-emitting element 21 (in other words, arrangement direction of the third and fourth surfaces 43 and 44). The plane A can also be understood as a line symmetry axis in front view and side view of FIG. 4, and cross-sectional view of FIG. 5. The upper portion and the lower portion of the first surface 41 are also plane symmetry with respect to the plane A. The upper portion and the lower portion of the second surface 42 are also plane symmetry with respect to the plane A.

The envelope 23 has a shape of rotation with a straight line B (see FIG. 5) that passes through the light-emitting element 21 and extends in the vertical direction of the light-emitting element 21 as a rotation axis. That is, the envelope 23 has a shape obtained by rotating a plane of a shape illustrated in FIG. 5 as a cross-sectional view by 180° around the straight line B (in other words, the rotation axis B).

Generally, when light enters a different medium, the light is refracted. Particularly, when light travels from a medium with a high refractive index to a medium with a low refractive index, total reflection occurs depending on the incidence angle to the boundary of these media. Total reflection occurs when the incidence angle of light is equal to or greater than a critical angle. When a typical refractive index of resin is 1.5 and a refractive index of air is 1.0, the Snell's law shows that the critical angle in an interface between the resin and air is approximately 42°.

In view of the foregoing, when the light from the light-emitting element 21 arrives at the third surface 43 and is totally reflected by the third surface 43 and guided to the first surface 41, it is possible to reduce light that leaks from the third surface 43, and to increase light extracted from the first surface 41. That is, the light extraction efficiency becomes higher. The light extraction efficiency becomes higher as the area in which total reflection occurs among the third surface 43 is larger. Accordingly, it is more preferable that total reflection occurs in the entire range in which light emitted from the light-emitting element 21 directly arrives among the third surface 43. For this purpose, what is necessary is to set the shape of the third surface 43 at all points in the above-described range of the third surface 43 so that the incidence angle $\theta$ (see FIG. 5) of the light from the light-emitting element 21 becomes equal to or greater than the critical angle of total reflection. The same comment applies to the shape of the fourth surface 44.

On the other hand, regarding the light that arrives at the first surface 41 directly from the light-emitting element 21, when such direct light enters the first surface 41 at an incidence angle equal to or smaller than the critical angle of total reflection, the direct light can be extracted to an air layer outside the first surface 41. In particular, when the incidence angle for the first surface 41 is 0°, that is, when the above-mentioned direct light enters the first surface 41 perpendicularly, the light can be extracted efficiently. Since the light extraction efficiency becomes higher as the area in which the incidence angle is 0° is larger among the first surfaces 41, it is more preferable that the incidence angle is 0° in the entire first surface 41. For this purpose, what is necessary is to set the shape of the first surface 41 so that the incidence angle of the direct light from the light-emitting element 21 is 0° at all the points of the first surface 41. Specifically, what is necessary is to make the first surface 41 a spherical shape centered on the position of the light-emitting element 21.

The shape of the envelope 23 will be described more specifically. In the cross-sectional view of FIG. 5, a profile line formed by the first surface 41 (that is, a line of intersection of the first surface 41 and a cutting plane that specifies the cross-sectional view of FIG. 5) will be referred to as a first profile line 51. Similarly, profile lines formed by the second to fourth surfaces will be referred to as second to fourth profile lines 52 to 54, respectively. The second profile line 52 corresponds to the above-mentioned rotation axis B.

Figure 6:
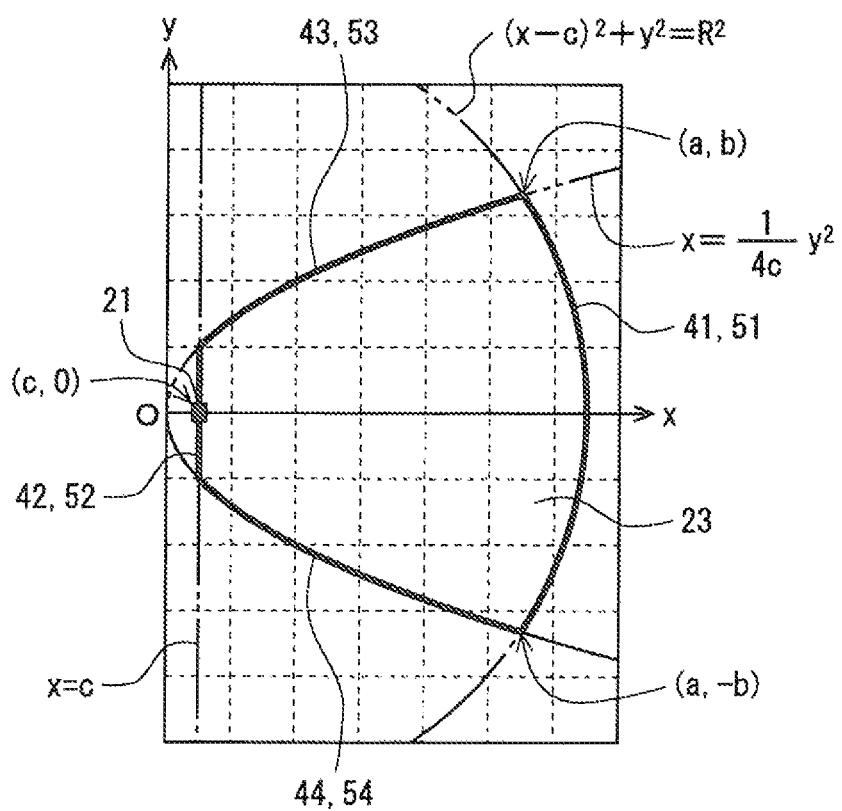
FIG. 6 is a diagram obtained by applying an xy coordinate system to FIG. 5.

FIG. 6 illustrates a diagram obtained by applying an xy coordinate system to FIG. 5 for description. In FIG. 6, the element substrate 22 is omitted. In FIG. 6, an x-axis passes through the light-emitting element 21, and a positive direction of the x-axis corresponds to forward of the light-emitting element 21, that is, the direction of light emission. A positive direction of a y-axis corresponds to an upward direction of the light-emitting element 21. A negative direction of the y-axis corresponds to a downward direction of the light-emitting element 21.

In FIG. 6, a coordinate in which the light-emitting element 21 is disposed is (c, 0). In this case, the second profile line 52 corresponding to the second surface 42 on which the light-emitting element 21 is disposed is expressed by following Equation (1).

[Equation 1]

$$x = c \quad (1)$$

The first profile line 51 corresponding to the spherical first surface 41 is expressed by following Equation (2).

[Equation 2]

$$(x-c)^2 + y^2 = R^2 \quad (2)$$

In Equation (2), R is a distance from the light-emitting element 21 to the first profile line 51, and is a radius of an arc shape formed by the first profile line 51.

The third and fourth profile lines 53 and 54 respectively corresponding to the third and fourth surfaces 43 and 44 are parabolas focused on the position (c, 0) of the light-emitting element 21, and are expressed by following Equation (3).

[Equation 3]

$$x = \frac{1}{4c} y^2 \quad (3)$$

That is, a range surrounded by the lines expressed by Equation (1) to (3) specifies a shape of a longitudinal section of the envelope 23 (in other words, a plane to be rotated in a shape of rotation with the straight line B (see FIG. 5) as a rotation axis). When a coordinate of an intersection of the first profile line 51 and the third profile line 53 is (a, b), a coordinate of an intersection of the first profile line 51 and the fourth profile line 54 is represented as (a, −b).

Since the third and fourth profile lines 53 and 54 are parabolas focused on the position of the light-emitting element 21, light arriving at the profile lines 53 and 54 from the light-emitting element 21 is reflected by the profile lines 53 and 54, and travels in parallel with the x-axis direction.

At this time, in order for total reflection to occur in the profile lines 53 and 54, it is necessary to make the incidence angle θ (see FIG. 5) to the profile lines 53 and 54 equal to or smaller than a critical angle $\theta_L$ for total reflection ($\theta \leq \theta_L$). Since the incidence angle θ is maximum at the coordinates (a, b) and (a, −b), the maximum incidence angle θ needs to become equal to or smaller than the critical angle $\theta_L$ for total reflection. That is, the maximum incidence angle θ is expressed by following Equation (4), and only needs to satisfy following Equation (5).

[Equation 4]

$$\theta = 90 - \tan^{-1}\left(\frac{b}{a}\right) \quad (4)$$

[Equation 5]

$$90 - \tan^{-1}\left(\frac{b}{a}\right) \leq \theta_L \quad (5)$$

Since the coordinates (a, b), and (a, −b) are also points on the line of Equation (3), following Equation (6) holds.

[Equation 6]

$$a = \frac{1}{4c} b^2 \quad (6)$$

The following Equations (7) and (8) are obtained from Equations (5) and (6).

[Equation 7]

$$\tan^{-1}\left(\frac{4c}{b}\right) \geq 90 - \theta_L \quad (7)$$

[Equation 8]

$$b \leq \frac{4c}{\tan(90 - \theta_L)} \quad (8)$$

That is, when b satisfies Equation (8), total reflection occurs.

Figure 7:
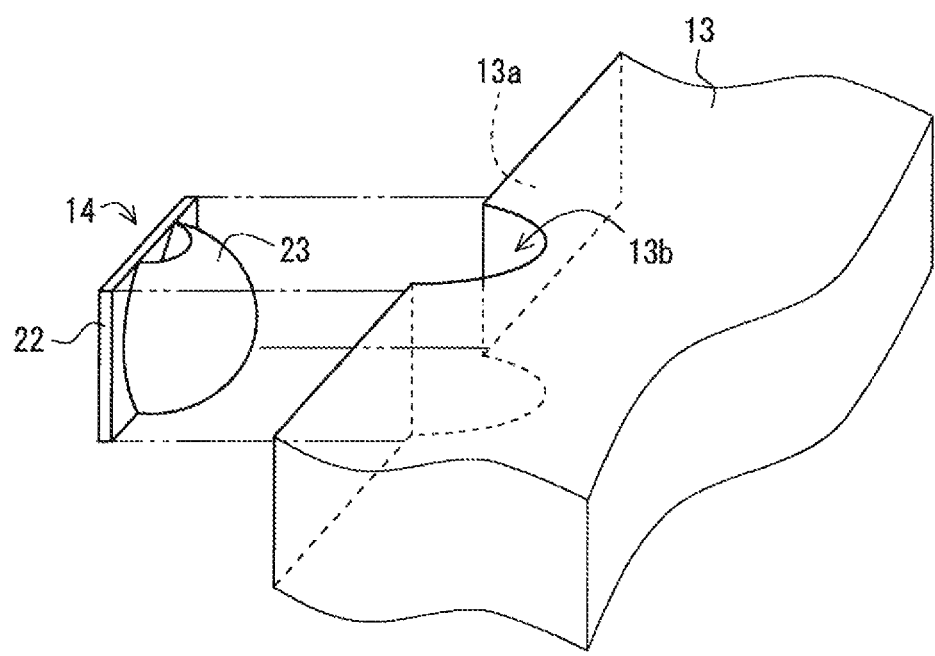
FIG. 7 is a partially enlarged perspective view of the planar light source device according to the first preferred embodiment.
Figure 8:
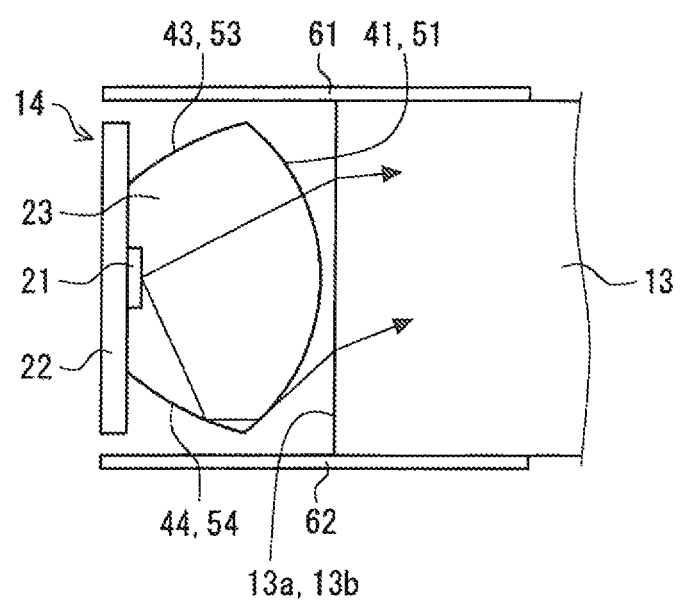
FIG. 8 is a partially enlarged cross-sectional view of the planar light source device according to the first preferred embodiment.
Figure 9:
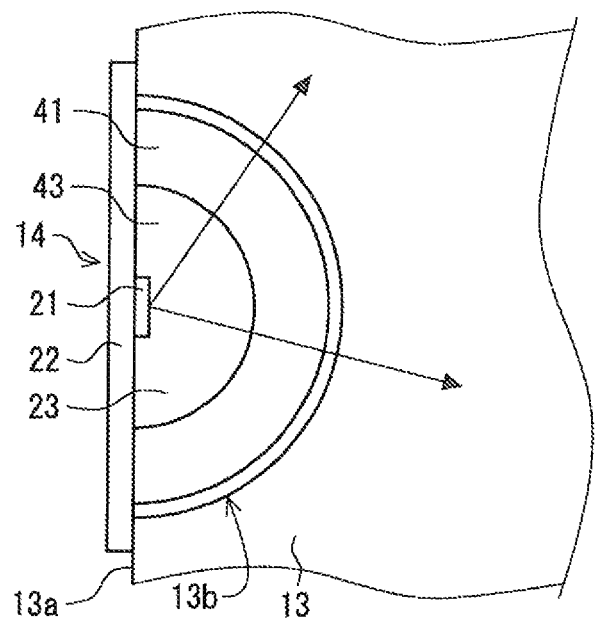
FIG. 9 is a partially enlarged plan view of the planar light source device according to the first preferred embodiment.

FIG. 7 illustrates a perspective view that enlarges a portion in a vicinity of the point light source 14 in the back light device 3. FIG. 8 and FIG. 9 illustrate a cross-sectional view and a plan view (in other words, top view) of the same portion, respectively. FIG. 7 illustrates a state in which the point light source 14 is separated from the light guide plate 13 for the sake of clarity.

As illustrated in FIG. 7 to FIG. 9, the point light source 14 is disposed with the envelope 23 facing the side surface 13a of the light guide plate 13. In the example of FIG. 7 to FIG. 9, the side surface 13a of the light guide plate 13 has a depressed portion 13b. The envelope 23 of the point light source 14 is inserted in the depressed portion 13b. Hereinafter, the depressed portion 13b of the side surface 13a may be referred to as an insertion portion 13b.

In the example of FIG. 7 to FIG. 9, the insertion portion 13b has a semi-cylinder shape with height in the thickness direction of the light guide plate 13. In the example of FIG. 7 to FIG. 9, the semi-cylinder shape forming the insertion portion 13b has arrived at both the front surface and the back surface of the light guide plate 13. In the semi-cylinder-shape insertion portion 13b, the insertion portion 13b has a shape along the first surface 41 of the envelope 23 in a plane orthogonal to the vertical direction of the light-emitting element 21.

The plane orthogonal to the vertical direction of the light-emitting element 21 may be a plane that crosses the point light source 14 and the light guide plate 13, and may be a plane that does not cross the point light source 14 and the light guide plate 13. When the plane does not cross the point light source 14 and the light guide plate 13, the shape of the insertion portion 13b and the first surface 41 can be understood from the plan view of FIG. 9 (in other words, top view). When the first surface 41 of the envelope 23 is spherical and the insertion portion 13b is cylindrical, in whatever way the plane may be selected, the insertion portion 13b will become a shape along the first surface 41.

The insertion portion 13b may be made to have a hemisphere shape along the first surface 41 of the envelope 23. Also in this example, the insertion portion 13b has a shape along the first surface 41 of the envelope 23 on the plane orthogonal to the vertical direction of the light-emitting element 21.

FIG. 8 and FIG. 9 illustrate a case where the first surface 41 of the envelope 23 does not touch the insertion portion 13b with the envelope 23 of the point light source 14 being inserted in the insertion portion 13b of the light guide plate 13. In contrast, the first surface 41 of the envelope 23 may touch the insertion portion 13b.

Next, how light emitted from the light-emitting element 21 enters the inside of the light guide plate 13 will be described.

With reference to the longitudinal sectional view of FIG. 8, the light that directly arrives at the first surface 41 of the envelope 23 from the light-emitting element 21 is hardly refracted by the first surface 41, and goes out to the air layer outside of the first surface 41. The light that goes out to the air layer enters the light guide plate 13 from the insertion portion 13b on the side surface 13a of the light guide plate 13.

With reference to FIG. 8, the light that travels from the light-emitting element 21 to the third and fourth surfaces 43 and 44 of the envelope 23 is reflected by the third and fourth surfaces 43 and 44, travels to the first surface 41 of the envelope 23, and is emitted from the first surface 41 to outside of the envelope 23.

More specifically, since the third and fourth profile lines 53 and 54 corresponding to the third and fourth surfaces 43 and 44 are parabola-shaped focused on the position of the light-emitting element 21, the light reflected by the third and fourth surfaces 43 and 44 travels in a direction orthogonal to the vertical direction of the light-emitting element 21 (in a direction parallel to the x-axis when referring to FIG. 6). The light then goes out from the first surface 41 of the envelope 23 into the outside air layer.

The light that enters the third and fourth surfaces 43 and 44 of the envelope 23 from the light-emitting element 21 is totally reflected by the third and fourth surfaces 43 and 44.

In this way, in the longitudinal section that passes through the light-emitting element 21, the light emitted from the light-emitting element 21 is efficiently collected in the first surface 41 of the envelope 23, and goes out in the air layer.

This makes it possible to reduce the number of times of reflection and optical path length in the envelope 23, thereby resulting stray light and intensity attenuation are supressed. This improves the utilization efficiency (in other words, light extraction efficiency) of the light emitted from the light-emitting element 21.

The third and fourth surfaces 43 and 44 can suppress the light reflected by the third and fourth surfaces 43 and 44 entering the first surface 41 at a large incidence angle, thereby more light can be traveled ahead of the first surface. This allows the light from the light-emitting element 21 to efficiently enter the light guide plate 13, and to efficiently travel far in the light guide plate 13, thereby improving the light utilization efficiency in the back light device 3. As a result, uniform in-plane brightness is obtained in the back light device 3. Such uniform in-plane brightness provides high display quality in the liquid crystal display device 1.

The above description has been made with reference to the longitudinal sectional view of FIG. 8. Considering that the envelope 23 has a shape of rotation (see the rotation axis B in FIG. 5), however, the above description is applicable to any longitudinal section that passes through the rotation axis B even if the longitudinal section is inclined to the element substrate 22. That is, the above-mentioned effect is achieved in the entire envelope 23.

On the other hand, with reference to the plan view of FIG. 9, the light emitted from the light-emitting element 21 is radially emitted in the envelope 23, arrives at the first surface 41 directly, or is reflected by the third or fourth surfaces 43, 44, and arrives at the first surface 41. Since the first surface 41 has a spherical shape centered on the light-emitting element 21, in the plan view of FIG. 9, the light from the light-emitting element 21 enters the first surface 41 almost perpendicularly, and goes out to the air layer. Accordingly, the light arriving at the first surface 41 is emitted into the air layer efficiently. That is, also from this point of view, the utilization efficiency (in other words, light extraction efficiency) of the light emitted from the light-emitting element 21 improves.

The light that goes out in the air layer then enters the light guide plate 13 from the insertion portion 13b of the side surface 13a of the light guide plate 13. At this time, since the insertion portion 13b of the light guide plate 13 has a shape along the first surface 41, in the plan view of FIG. 9, the light also enters the insertion portion 13b of the light guide plate 13 almost perpendicularly. Accordingly, it is possible to suppress the reflection by the interface between the air layer and the insertion portion 13b of the light guide plate 13.

With reference to FIG. 9, the light from the light-emitting element 21 enters both of the first surface 41 of the envelope 23 and the insertion portion 13b of the light guide plate 13 perpendicularly, as described above. Therefore, after the light from the light-emitting element 21 passes through the envelope 23, and enters the light guide plate 13, the light travels radially. Accordingly, intensity distribution of the light that enters the light guide plate 13 becomes almost equivalent to light-emitting intensity distribution of the light-emitting element 21. Such a point also contributes to uniform in-plane brightness and high display quality in the back light device 3 and the liquid crystal display device 1.

In the example of FIG. 8, reflective sheets 61 and 62 are disposed in the upper and lower sides of the envelope 23 of the point light source 14. The reflective sheets 61 and 62 can turn, for example, stray light generated in the insertion portion 13b of the light guide plate 13 to the light guide plate 13. As a result, the amount of light that enters the light guide plate 13 increases, which contributes to the improvement in brightness. A reflective sheet 12 that is laid under the light guide plate 13 may be used as the lower side reflective sheet 62. Alternatively, the reflective sheet 62 may be provided as a member different from the reflective sheet 12.

In the above description, the case where the longitudinal section of the third and fourth surfaces 43 and 44 of the envelope 23 (see the third and fourth profile lines 53 and 54 of FIG. 5) is parabola-shaped has been illustrated. The parabola shape however may be approximated by one or more straight lines. Such an approximated shape can simplify processing of the envelope 23.

Second Preferred Embodiment

Figure 10:
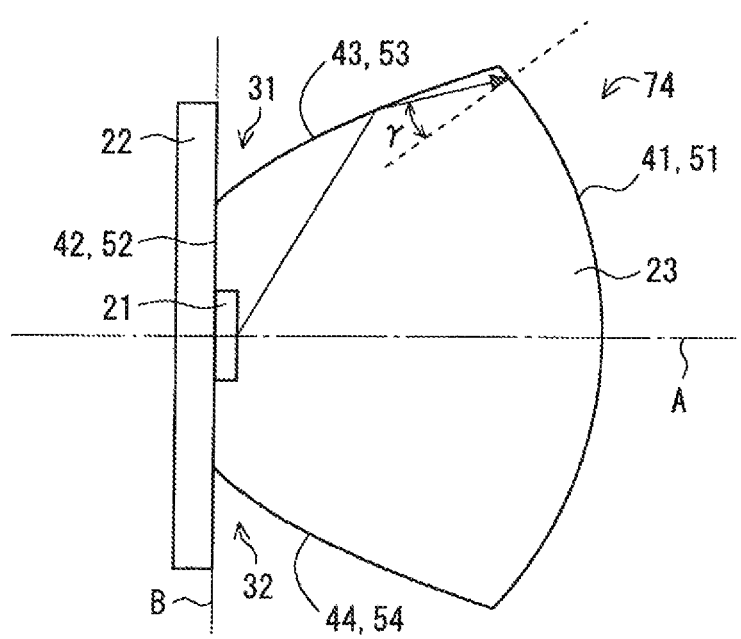
FIG. 10 is a cross-sectional view of the point light source according to a second preferred embodiment.
Figure 11:
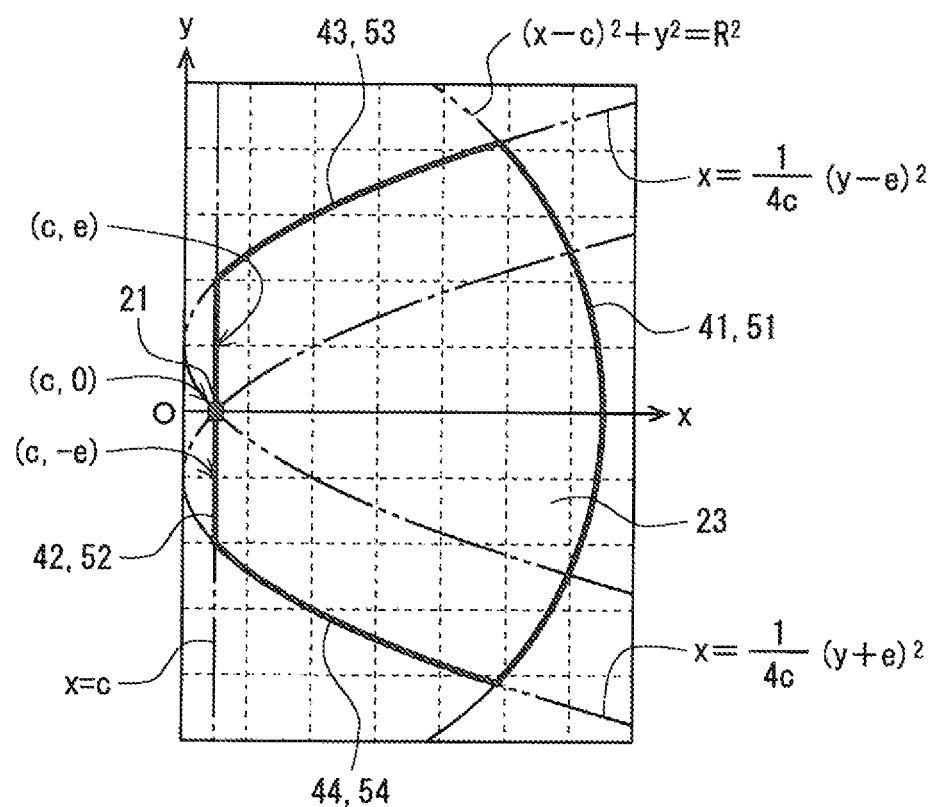
FIG. 11 is a diagram obtained by applying an xy coordinate system to FIG. 10.

FIG. 10 illustrates a cross-sectional view of a point light source 74 according to a second preferred embodiment. FIG. 11 illustrates a diagram obtained by applying an xy coordinate system to FIG. 10. FIG. 10 and FIG. 11 correspond to FIG. 5 and FIG. 6, respectively. A shape of an envelope 23 differs between the point light source 74 according to the second preferred embodiment and the point light source 14 according to the first preferred embodiment. Other configuration of the point light source 74 is basically the same as that of the point light source 14. The point light source 74 is applicable to a back light device 3 (see FIG. 2). The back light device 3 on which the point light source 74 is mounted is applicable to a liquid crystal display device 1 (see FIG. 1).

Regarding a difference of the envelope 23, a third profile line 53 in the point light source 74 has a parabola shape (first parabola shape) obtained by moving the third profile line 53 in the point light source 14 to an upper side of a light-emitting element 21. A fourth profile line 54 in the point light source 74 has a parabola shape (second parabola shape) obtained by moving the fourth profile line 54 in the point light source 14 to a lower side of the light-emitting element 21.

Specifically, when the amount of movement of the third profile line 53 is e, the third profile line 53 corresponds to a parabola shape focused on a point (c, e). The parabola shape is expressed by following Equation (9).

[Equation 9]

$$x = \frac{1}{4c}(y-e)^2 \qquad (9)$$

The amount of movement of the fourth profile line 54 is the same as that of the third profile line 53. In this case, the fourth profile line 54 corresponds to a parabola shape focused on a point (c, −e). The parabola shape is expressed by following Equation (10).

[Equation 10]

$$x = \frac{1}{4c}(y+e)^2 \qquad (10)$$

A first profile line 51 corresponding to a first surface 41 is expressed by Equation (2) described above. A second profile line 52 corresponding to a second surface 42 is expressed by Equation (1) described above.

That is, a range surrounded by the lines expressed by Equation (1), (2), (9), and (10) specifies a shape of a longitudinal section of the envelope 23 of the point light source 74 (in other words, a plane to be rotated in a shape of rotation with the second profile line 52 as a rotation axis).

An incidence angle γ at which the light totally reflected by a third surface 43 enters the first surface 41 (see FIG. 10) becomes small compared with the incidence angle according to the first preferred embodiment by shifting the focus of the parabola shape corresponding to the third surface 43 in the y-axis direction (+y direction). Accordingly, the light entering the first surface 41 can efficiently travel to the air layer. Such an effect can also be achieved similarly in the fourth surface 44.

Since the size of the second surface 42 in the y-axis direction becomes longer, a contact area between the second surface 42 and an element substrate 22 becomes larger. This makes it possible to increase bonding strength between the envelope 23 and the element substrate 22. This also makes it possible to avoid a shape in which the envelope 23 protrudes long and thin ahead of the light-emitting element 21. This makes it possible to increase the strength of the envelope 23 itself.

Regarding a configuration common to the point light sources 74 and 14, the point light source 74 achieves the effect similar to that of the point light source 14.

<Variation>

A display panel 2 is not limited to a liquid crystal panel. For example, a transparent plate on which a character, a figure, and the like are drawn can be used as the display panel 2. A planar light source device 3 is also applicable to application other than a back light device of a display device. For example, the planar light source device 3 may be used as an indoor illumination device. In addition, the point light sources 14 and 74 are also applicable to application other than the planar light source device 3. For example, the point light sources 14 and 74 may be used as an indoor illumination device.

In the present invention, the above preferred embodiments can be arbitrarily combined, or each preferred embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A point light source comprising:
a light-emitting element; and
an envelope that has light-transmitting property and seals said light-emitting element,
wherein said envelope includes:
a first surface having a spherical shape centered on said light-emitting element and protruding ahead of said light-emitting element and extending to a left side and a right side of said light-emitting element when viewed from said light-emitting element, the entire first surface being convex;
a second surface connected to said first surface on the left side and the right side of said light-emitting element and being in contact with said light-emitting element;
a third surface directly connected to an upper end of said first surface and connected to an upper end of said second surface and forming a first depression that sinks from said first surface toward said second surface, and said first depression is positioned entirely within the convex first surface when viewed from an opposite side of said first surface from said light-emitting element; and a fourth surface directly connected to a lower end of said first surface and connected to a lower end of said second surface and forming a second depression that sinks from said first surface toward said second surface, and said second depression is positioned entirely within the convex first surface when viewed from an opposite side of said first surface from the light-emitting element.

2. The point light source according to claim 1, wherein said third and fourth surfaces have a half-conical shape with a vertex pointing at said light-emitting element.

3. The point light source according to claim 1, wherein said envelope has a shape of rotation with a straight line through said light-emitting element extending in a vertical direction of said light-emitting element as a rotation axis.

4. The point light source according to claim 1, wherein said third and fourth surfaces have a parabola shape focused on a position of said light-emitting element in a cross-section passing through said light-emitting element and said first to fourth surfaces.

5. The point light source according to claim 1, wherein said third surface has a first parabola shape obtained by moving a parabola shape focused on a position of said light-emitting element to an upper side of said light-emitting element in a cross-section passing through said light-emitting element and said first to fourth surfaces, and
said fourth surface has a second parabola shape obtained by moving said parabola shape focused on a position of said light-emitting element to a lower side of said light-emitting element in said cross-section.

6. The point light source according to claim 1, wherein said light-emitting element is a light-emitting diode.

7. A planar light source device comprising:
a point light source described in claim 1; and
a light guide plate disposed with a side surface facing said point light source.

8. The planar light source device according to claim 7, wherein said side surface of said light guide plate has an insertion portion in which said envelope of said point light source is inserted, said insertion portion has a shape along said first surface of said envelope on a plane orthogonal to a vertical direction of said light-emitting element of said point light source.

9. A display device comprising:
a planar light source device described in claim 7; and
a display panel disposed on said planar light source device.

10. A point light source comprising:
a light-emitting element; and
an envelope that has light-transmitting property and seals said light-emitting element, said envelope including
a first surface protruding ahead of said light-emitting element and extending to a left side and a right side of said light-emitting element when viewed from said light-emitting element, the entire first surface being convex;
a second surface connected to said first surface on the left side and the right side of said light-emitting element and being in contact with said light-emitting element;
a third surface connected to an upper end of said first surface and an upper end of said second surface and forming a first depression that sinks from said first surface toward said second surface; and
a fourth surface connected to a lower end of said first surface and a lower end of said second surface and forming a second depression that sinks from said first surface toward said second surface, wherein
said third and fourth surfaces have a half-conical shape with a vertex pointing at said light-emitting element, thereby said first and second depressions have said half-conical shape,
said envelope has a shape of rotation with a straight line through said light-emitting element extending in a vertical direction of said light-emitting element as a rotation axis,
an xy coordinate system is applied to a cross-section passing through said light-emitting element and said first to fourth surfaces, in which an x-axis passes through said light-emitting element, a positive direction of said x-axis corresponds to forward of said light-emitting element and a positive direction of a y-axis corresponds to an upward direction of said light-emitting element,
a coordinate in which said light-emitting element is disposed is (c, 0), a second profile line corresponding to said second surface and said rotation axis are expressed by following Equation (1)

$$x = c \qquad (1)$$

R is a distance from said light-emitting element to a first profile line corresponding to said first surface and is a radius of an arc shape formed by said first profile line, said first profile line is expressed by following Equation (2)

$$(x-c)^2 + y^2 = R^2 \qquad (2), \text{ and}$$

third and fourth profile lines respectively corresponding to said third and fourth surfaces are parabolas focused on the position (c, 0) of said light-emitting element, and are expressed by following Equation (3)

$$x = \frac{1}{4c} y^2. \qquad (3)$$

* * * * *